(12) United States Patent
Daniels

(10) Patent No.: US 11,363,721 B2
(45) Date of Patent: Jun. 14, 2022

(54) RADIO-FREQUENCY IDENTIFICATION (RFID) LABEL OR CONDUCTIVE TRACE THERMAL TRANSFER PRINTING METHOD

(71) Applicant: XEROX CORPORATION, Norwalk, CT (US)

(72) Inventor: Marc D. Daniels, Webster, NY (US)

(73) Assignee: XEROX CORPORATION, Norwalk, CT (US)

( * ) Notice: Subject to any disclaimer, the term of this patent is extended or adjusted under 35 U.S.C. 154(b) by 99 days.

(21) Appl. No.: 17/001,849

(22) Filed: Aug. 25, 2020

(65) Prior Publication Data

US 2020/0389981 A1    Dec. 10, 2020

Related U.S. Application Data

(62) Division of application No. 16/277,930, filed on Feb. 15, 2019, now Pat. No. 10,813,225.

(51) Int. Cl.
*H05K 3/12* (2006.01)
*H05K 3/20* (2006.01)
*H05K 3/04* (2006.01)

(52) U.S. Cl.
CPC ............ *H05K 3/1258* (2013.01); *H05K 3/20* (2013.01); *H05K 3/046* (2013.01); *H05K 2203/0152* (2013.01)

(58) Field of Classification Search
CPC .............................................. H05K 2203/1545
See application file for complete search history.

(56) References Cited

U.S. PATENT DOCUMENTS

| 4,531,135 | A  | * | 7/1985  | Toshima ............... B41J 17/38 347/217 |
| 5,437,912 | A  |   | 8/1995  | Chou et al. |
| 5,739,189 | A  | * | 4/1998  | Lorenz ............... B41M 5/392 524/424 |
| 5,814,580 | A  |   | 9/1998  | Onishi et al. |
| 2003/0196747 | A1 | * | 10/2003 | Kwasny ............ B41M 7/0027 156/583.1 |
| 2009/0250522 | A1 |   | 10/2009 | Williams et al. |
| 2012/0086764 | A1 |   | 4/2012  | Golda et al. |

(Continued)

OTHER PUBLICATIONS

Author Unknown, "Using Conductive Thermal Transfer Ribbons for Printed Electronics," Metallograph white paper, first downloaded on Oct. 23, 2018 from https://spf-inc.com/wp-content/uploads/2016/05/Metallograph-Conductive-Ribbon-White-Paper.pdf, 5 pages.

*Primary Examiner* — Moazzam Hossain
(74) *Attorney, Agent, or Firm* — MH2 Technology Law Group LLP

(57) ABSTRACT

A method and structure for forming conductive structure such as an electric circuit, or a portion of an electric circuit, can include the use of a thermal print head and a ribbon including a carrier and a metal layer. The thermal print head is used to print a first portion of the metal layer onto a sacrificial print medium. The first portion printed has a first pattern, where a second portion having a second pattern remains on the carrier. The first pattern is a reverse image at least a portion of the electric circuit, while the second pattern includes at least a portion of the electric circuit. The second portion having the second pattern can be transferred to a circuit substrate, then used as an electric circuit.

20 Claims, 5 Drawing Sheets

(56) References Cited

U.S. PATENT DOCUMENTS

| | | | | |
|---|---|---|---|---|
| 2013/0333094 | A1* | 12/2013 | Rogers | A61B 34/76 340/407.1 |
| 2016/0101608 | A1 | 4/2016 | Wolzeschke | |
| 2016/0195836 | A1 | 7/2016 | Chun et al. | |
| 2019/0383649 | A1* | 12/2019 | Abdo | B32B 27/36 |

* cited by examiner

RADIO-FREQUENCY IDENTIFICATION (RFID) LABEL OR CONDUCTIVE TRACE THERMAL TRANSFER PRINTING METHOD

CROSS-REFERENCE TO RELATED APPLICATION

This is a divisional application of, and claims priority to, U.S. patent application Ser. No. 16/277,930, filed Feb. 15, 2019, the disclosure of which is incorporated herein by reference in its entirety.

TECHNICAL FIELD

The present teachings relate to the field of electric circuits and, more particularly, to printing of electric circuits and other electrically conductive structures using thermal printing.

BACKGROUND

Electric circuits and other electrically conductive structures can be formed using one of several manufacturing techniques. For example, optical photolithography can be used to form extremely small and precise electrical circuits. However, optical photolithography is an expensive process requiring costly equipment, the use of various chemicals in relatively large quantities, and an extended processing time. Further, masks and reticles used in optical photolithography are expensive and circuit specific, and are therefore best used when forming a large number of the same circuit design.

In contrast, thermal printing offers a low cost method for printing electrical circuits and other electrically conductive structures. A thermal printer includes a print head having a plurality of heating pins, with each heating pin representing a single pixel. A ribbon, including an electrically conductive metal layer provided on a thin carrier layer (hereinafter, "carrier") such as a polymer layer, is drawn between the print head and a print medium, typically an electrically non-conductive circuit substrate, such that the metal layer physically contacts the print medium. Software instructions activate a plurality of heating pins such that the activated heating pins physically contact the carrier. Thermal energy is transferred from the heating pins to the carrier, and from the carrier to the metal layer, thereby melting the metal layer at the location of the heating pin and transferring the metal layer at the location of the heating pins from the carrier to the print medium in a desired pattern.

Because the pattern of the circuit that is printed by the thermal printer is controlled through software, the thermal printer is quickly and easily customizable for different circuit designs and thus lends itself to printing a smaller number of a particular design than some other methods of circuit formation such as optical photolithography.

SUMMARY

The following presents a simplified summary in order to provide a basic understanding of some aspects of one or more implementations of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

In an implementation of the present teachings, a method for forming an electric circuit includes placing a metal layer in physical contact with a sacrificial print medium, heating a carrier layer to which the metal layer is attached, wherein a heating pattern applied to the carrier is a first pattern, heating a first portion of the metal layer attached to the carrier, wherein a heating pattern applied to the first portion of the metal layer approximates the first pattern, and attaching the first portion of the metal layer to the sacrificial print medium. The method further includes separating the carrier from the sacrificial print medium wherein, during the separating, the first portion of the metal layer remains attached to the sacrificial print medium and detaches from the carrier, a second portion of the metal layer remains attached to the carrier, the second portion of the metal layer has a second pattern that is a reverse image of the first heating pattern, and the second portion of the metal layer provides at least a portion of the electric circuit.

Optionally, the method can include heating the carrier layer using a thermal print head during the heating of the carrier layer to which the metal layer is attached. Further optionally, subsequent to the separating, the method can include heating the second portion of the metal layer and, subsequent to heating the second portion of the metal layer, the second portion of the metal layer can be transferred to a circuit substrate. The method can also include cutting the circuit substrate to separate a plurality of electric circuits from each other. The second portion of the metal layer can be heated using a heat/pressure fuser during the heating of the second portion of the metal layer.

In an implementation, the metal layer can include at least one of silver, a silver/copper composite, copper, aluminum, gold, and a metal alloy having a thickness of from 0.5 micrometers ($\mu m$) to 15 $\mu m$. The carrier can include at least one of paper, polyester, polyimide, and fabric having a thickness of from 25 $\mu m$ to 75 $\mu m$, and the sacrificial print medium can include at least one of paper, polyester, polyimide, and fabric having a thickness of from 25 $\mu m$ to 75 $\mu m$.

Optionally, the heating of the carrier layer can include heating the carrier layer to a temperature of from 175° C. to 225° C., and the heating of the first portion of the metal layer can heat the first portion of the metal layer to a temperature of from 175° C. to 225° C.

In another implementation, a method for forming an electric circuit using a printing process includes placing a ribbon including a carrier and a metal layer between a thermal print head and a sacrificial print medium, physically contacting the carrier with the thermal print head, thereby heating the carrier with a first heat pattern, and heating a first portion of the metal layer attached to the carrier, wherein a first pattern of the first portion of the metal layer approximates the first heat pattern and melts the first portion of the metal layer. The method further includes cooling the first portion of the metal layer and separating the ribbon from the sacrificial print medium. During the separating, the first portion of the metal layer remains attached to the sacrificial print medium and detaches from the carrier. During the separating, a second portion of the metal layer remains attached to the carrier, wherein the second portion of the metal layer has a second pattern that is a reverse image of the first pattern. The method further includes physically contacting the second portion of the metal layer with a circuit substrate, heating the second portion of the metal layer attached to the carrier, cooling the second portion of the metal layer, and separating the carrier from the circuit substrate wherein, during the separating of the carrier from the circuit substrate, the second portion of the metal layer remains attached to the circuit substrate and detaches from the carrier.

Optionally, the method can further include supplying the ribbon to the thermal print head using a ribbon supply reel and collecting the carrier using a carrier take-up reel after the separating of the carrier from the circuit substrate. The method can also include cutting the circuit substrate to separate a plurality of electric circuits from each other. The method can also include supplying the sacrificial print medium to the thermal print head using a sacrificial print medium supply reel and collecting the sacrificial print medium and the first portion of the metal layer using a sacrificial print medium take-up reel after the separating of the ribbon from the sacrificial print medium.

In an implementation, the method can include heating the second portion of the metal layer using a heating element during the heating of the second portion of the metal layer attached to the carrier, supplying the circuit substrate to the heating element using a circuit substrate supply reel, and collecting at least a portion of the circuit substrate on a circuit substrate take-up reel after the separating of the carrier from the circuit substrate.

The collecting of the at least the portion of the circuit substrate can further include collecting a plurality of electric circuits on the circuit substrate take-up reel. The method can also include cutting the circuit substrate to separate a plurality of electric circuits from each other.

In another implementation of the present teachings, a thermal printing system for forming a plurality of electric circuits includes a thermal print head, a sacrificial print medium positioned adjacent to the thermal print head, and a ribbon positioned between the thermal print head and the sacrificial print medium. The ribbon includes a carrier and a metal layer, and the thermal print head is configured to print a first portion of the metal layer onto the sacrificial print medium. In this implementation, the first portion of the metal layer is a negative image of at least one electric circuit. Subsequent to printing the first portion of the metal layer, a second portion of the metal layer remains on the carrier. This implementation further includes a circuit substrate positioned adjacent to the carrier and the second portion of the metal layer, and a heating element for transferring the second portion of the metal layer from the carrier onto the circuit substrate.

Optionally, the thermal printing system can include a ribbon supply reel configured to supply the ribbon to the thermal print head and a carrier take-up reel configured to receive the carrier after transferring the second portion of the metal layer to the circuit substrate. The thermal printing system can further include a sacrificial print medium supply reel configured to supply the sacrificial print medium to the thermal print head and a sacrificial print medium take-up reel configured to receive the sacrificial print medium and the first portion of the metal layer subsequent to printing the first portion of the metal layer, and can also include a circuit substrate supply reel configured to supply the circuit substrate to the heating element and a circuit substrate take-up reel configured to receive at least a portion of the circuit substrate subsequent to the transferring of the second portion of the metal layer to the circuit substrate.

In an implementation, the thermal printing system can optionally include at least one cutter configured to punch a perimeter of the plurality of electric circuits from the circuit substrate subsequent to transferring the second portion of the metal layer to the circuit substrate, thereby singularizing the plurality of electric circuits, and can also include a controller configured to provide printing instructions to the thermal print head.

BRIEF DESCRIPTION OF THE DRAWINGS

The accompanying drawings, which are incorporated in, and constitute a part of this specification, illustrate implementations of the present teachings and, together with the description, serve to explain the principles of the disclosure. In the figures.

It should be noted that some details of the figures have been simplified and are drawn to facilitate understanding of the present teachings rather than to maintain strict structural accuracy, detail, and scale.

DETAILED DESCRIPTION

Reference will now be made in detail to exemplary implementations of the present teachings, examples of which are illustrated in the accompanying drawings. Wherever convenient, the same reference numbers will be used throughout the drawings to refer to the same or like parts.

For simplicity of explanation, the present teachings are discussed with reference to thermal printing of an electric circuit. However, this description in no way limits the present teachings to electric circuits. It will be appreciated that thermal printing of electrically conductive structures other than an electric circuit are contemplated and within the scope of the present teachings.

As stated above, thermal printing of a metal layer onto a print medium has various advantages in some uses over other circuit formation techniques. However, the minimum resolution of the completed circuit features is limited by the size of the heating pins. For example, typical thermal printheads have a resolution of from about 200 dots per inch (DPI) to 600 DPI. Furthermore, an electrical conductivity of the thermally transferred circuit structures such as conductive traces and/or interconnects is limited by the efficiency of the transfer. Under magnification of the printed metal layer during inspection, minute voids in the resulting metal features can be observed after printing the electric circuit. These voids in the printed metal layer result in a decreased electrical conductivity and an increased electrical resistance of the printed circuit features compared to predicted values that are theoretically possible with a perfect transfer of the metal layer to the print medium.

An implementation of the present teachings can result in an electric circuit that is printed through the use of a thermal printer. The conductive features of the resulting circuit can have an improved electrical conductivity over the same circuit formed with conventional thermal printing methods. This improvement in electrical conductivity can be obtained using an implementation of the present teachings without modification to the thermal printer itself.

In-process structures which can be formed during an implementation of the present teachings are depicted in FIGS. 1-5, which are described below. It will be appreciated the figures depict one implementation of the present teachings and, in other contemplated implementations, other features that are not depicted may be employed and various depicted structures may be removed or modified.

Figure 1:
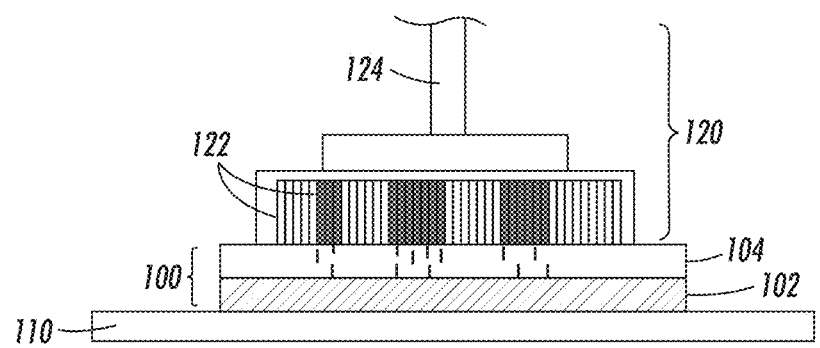
FIG. 1 is a cross section depicting a thermal print head, a ribbon, and a sacrificial print medium in accordance with an implementation of the present teachings.

FIG. 1 depicts a ribbon 100 including a metal layer (e.g., a metal foil layer) 102 positioned on a carrier 104. The metal layer 102 can be or include a metal such as silver, a silver/copper composite, copper, aluminum, gold, a metal alloy, or another suitable metal, and can have a thickness of from about 0.25 micrometers (μm) to about 25 μm, or from about 0.5 μm to about 15 μm. A metal layer that is excessively thin can result in a feature that has an excessively high electrical resistance and that melts too quickly and over too large of an area during processing. A metal layer 102 that is excessively thick can result in insufficient melting and a resulting unsuitable transfer of the metal layer 102 during processing, and may be too rigid for processing according to the implementations described herein.

The carrier 104 can be or include a material such as polyacrylate, polyester, polyethylene, or another suitable material. The carrier 104 and can have a thickness of from about 1.5 μm to about 15 μm, or from about 3 μm to about 9 μm. A carrier 104 that is too thin can be damaged from tensile stress applied to the carrier 104 during processing, for example, using a thermal processing system 600 such as that depicted in FIG. 6, while a carrier 104 that is too thick can result in insufficient transfer of heat through the carrier 104 to melt the metal layer 102 during processing as described below.

FIG. 1 further depicts a sacrificial print medium (i.e., a waste medium, a negative print medium, or a waste substrate) 110. The sacrificial print medium 110 may be formed from a material such as paper, polyester, polyimide, fabric, or another suitable material. The sacrificial print medium 110 can have a thickness of from about 15 μm to about 100 μm, or from about 25 μm to about 75 μm. A sacrificial print medium 110 that is that is excessively thin can be damaged from tensile stress applied to the sacrificial print medium 110 during processing, for example, using a thermal processing system 600 such as that depicted in FIG. 6, while a sacrificial print medium 110 that is too thick may be too rigid for processing according to the implementations described herein.

FIG. 1 additionally depicts a thermal print head 120. In one implementation, the thermal print head 120 includes a plurality (i.e., an array) of heating pins 122 and a data bus 124 through which printing instructions are provided to the thermal print head 120 from a controller 602 (depicted in FIG. 6 and described in more detail below). Information regarding the status of the thermal print head 120 can also be provided to the controller 602 through the data bus 124. The data bus 124 may be or include a cable and/or a wireless connection. The controller 602 and the thermal print head 120 can be separate devices or integrated into a single standalone device.

Figure 2:
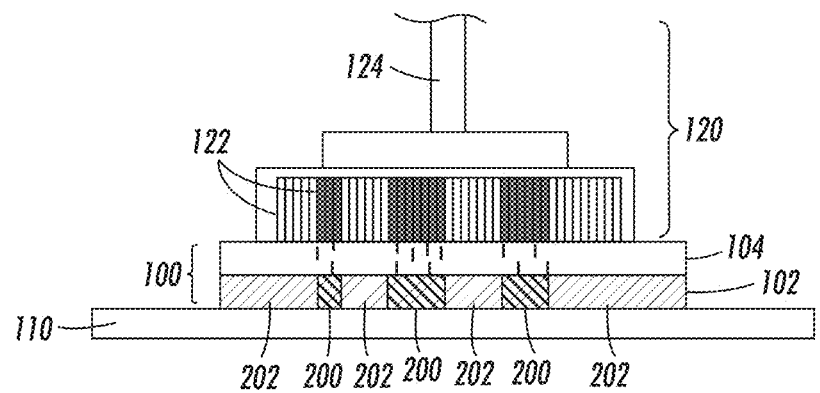
FIG. 2 depicts the FIG. 1 structure during heating of first portions of a metal layer.

As depicted in FIG. 1, the ribbon 100 is positioned between the thermal print head 120 and the sacrificial print medium. In particular, the metal layer 102 of the ribbon 100 can be physically contacted with the sacrificial print medium 110, and the thermal print head 120 is physically contacted with the carrier 104 of the ribbon. The heating pins 122 are heated in a pattern that is input from the controller (and may be stored within memory of the thermal print head 120) to the thermal print head 120. In one implementation, a first subset of the plurality of heating pins 122 is heated while a second subset of the plurality of heating pins 122 is not heated. The thermal energy from the first subset is transferred to the carrier 104 as depicted in FIG. 1, and then to the metal layer 102 as depicted in FIG. 2. The thermal energy is sufficient to melt a first portion 200 of the metal layer 102, while a second portion 202 of the metal layer remains in solid form. Subsequently, the first portion 200 of the metal layer is cooled and solidified.

Upon melting and cooling of the first portion 200 of the metal layer 102, an adhesive bond between the sacrificial print medium 110 and the first portion 200 of the metal layer 102 becomes stronger than an adhesive bond between the carrier 104 of the ribbon 100 and the first portion 200 of the metal layer 102. As a result, when the carrier 104 is separated from the sacrificial print medium 110, the first portion 200 that was melted by the thermal print head 120 remain attached to the sacrificial print medium 110 and detach from the carrier 104, while the second portion 202 that was not melted by the thermal print head 120 remains attached to the carrier 104 of the ribbon 100.

It will be appreciated that the first portion 200 of the metal layer 102 thus forms and provides a first metal pattern 300 while the second portion 202 forms and provides a second metal pattern 302 that is different than the first metal pattern. In one aspect, the second metal pattern 302 is a reverse image of the first metal pattern 300 that is printed by the thermal print head 120 during the process depicted in FIGS. 1-3. Particularly, the first metal pattern 300 printed by the thermal print head 120 is a reverse image of the second metal pattern 302, where the second metal pattern 302 is the pattern that forms the desired circuit (or a portion of the desired circuit) and the first metal pattern 300 is a reverse image of the desired circuit (or a reverse image of the portion of the desired circuit).

Figure 3:
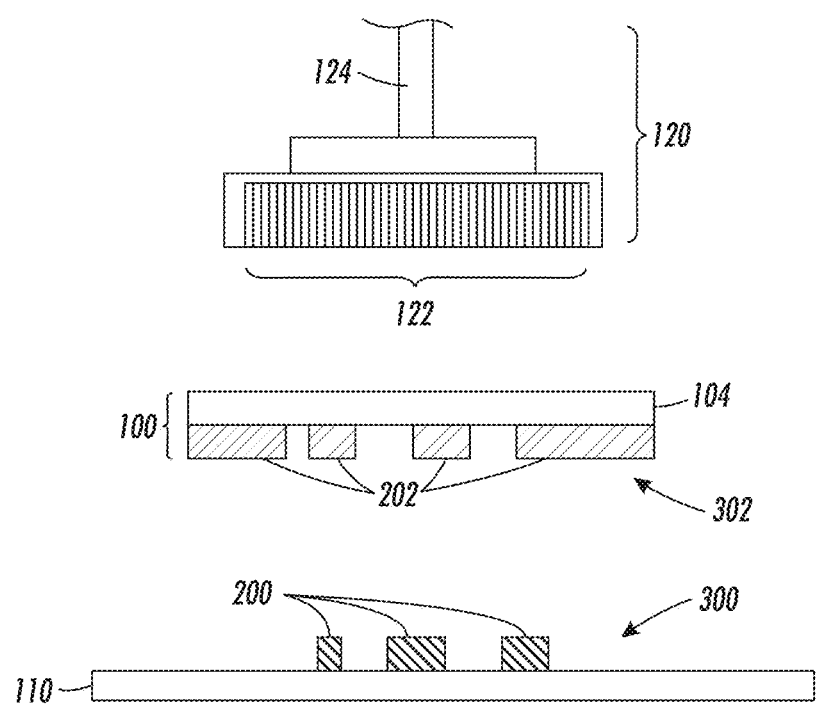
FIG. 3 depicts the FIG. 2 structure after separating a carrier of the ribbon and the sacrificial print medium.

In some implementations, the ribbon 100 including the carrier 104 and the second portion 202 of the metal layer 102 as depicted in FIG. 3 may be used as a circuit without additional processing. In other implementations, some additional processing may be desirable or required. For example, the carrier 104 may not be suitable as an electrically insulative substrate for the circuit provided by the second pattern 302, or the carrier 104 may require segmentation to separate plural printed circuits from each other. In some uses, the second pattern 302 may require connection to a power source such as a battery (not depicted herein for simplicity).

Figure 4:
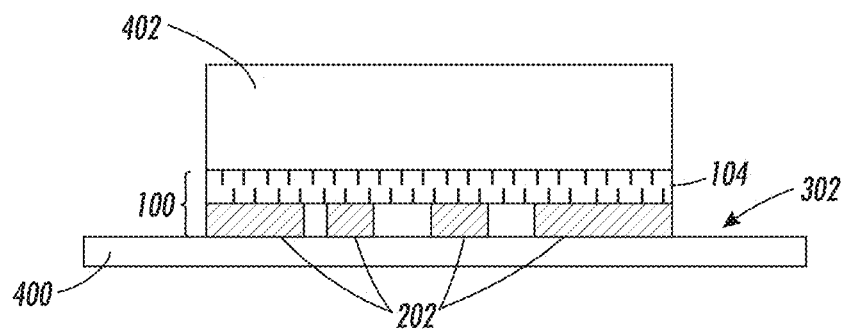
FIG. 4 is a cross section depicting heating of the carrier and the remaining portion of the metal layer using a heating element.

The additional processing may also include a transfer process to transfer the second portion 202 of the metal layer 102 from the carrier 104 to a suitable (or more suitable) circuit substrate. In one transfer process, the second portion 202 of the metal layer 102 is physically contacted with a layer 400 that will provide a circuit substrate 400 as depicted in FIG. 4. The second portion of the metal layer 102 transferred from the carrier 104 to the circuit substrate 400 may also be referred to as a "third portion" 202 of the metal layer 102. The layer 400 may be or include paper, polyester, polyimide, fabric, or another suitable material. The circuit substrate 400 may have a thickness of from about 15 μm to about 100 μm, or from about 25 μm to about 75 μm. A circuit substrate 400 that is that is excessively thin can be damaged from tensile stress applied to the circuit substrate 400 during processing, for example, using a thermal processing system 600 such as that depicted in FIG. 6. A circuit substrate 400 that is too thick may be too rigid for processing according to the implementations described herein. Additionally, a circuit substrate 400 that is either excessively thick or thin may not be suitable for the eventual use of the completed circuit.

Figure 5:
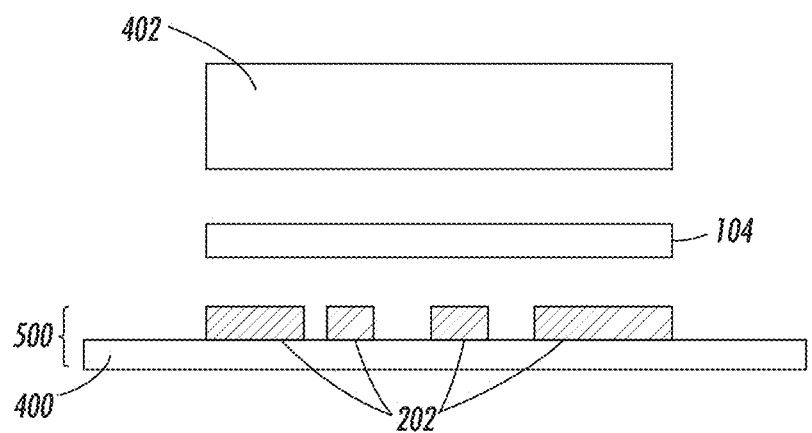
FIG. 5 depicts the FIG. 4 structure after separating the carrier from a circuit substrate.

A heating element 402, which may be the thermal print head 120, a fuser element, or another type of heating element, is placed in physical contact with the carrier 104. Thermal energy is transferred from the heating element 402 through the carrier 104 to the second portion 202 through conductive heating (i.e., thermal conduction). The second portion 202 may become molten during this heating. After heating, the second portion 202 is cooled. Upon melting and cooling of the second portion 202 of the metal layer 102, an adhesive bond between the circuit substrate 400 and the second portion 202 of the metal layer 102 becomes stronger than an adhesive bond between the carrier 104 of the ribbon 100 and the second portion 202. As a result, when the carrier 104 is separated from the circuit substrate 400 as depicted in FIG. 5, the second portion 202 that was melted and/or heated by the heating element 402 remains attached to the circuit substrate 400 and detaches from the carrier 104. The second portion 202 of the metal layer 102 and the circuit substrate 400 thus provide, or can be further processed to provide, an electric circuit 500 such as a radio-frequency identification (RFID) chip or another electric circuit 500. The RFID chip may be in the form of a label, and may include other features such as a pressure-sensitive adhesive (not individually depicted for simplicity) for securing the RFID chip to a surface. Further processing may include, for example, attachment of the second portion 202 to a power source such as a battery (not individually depicted for simplicity) to provide an active RFID chip. In another implementation, the second portion 202 and the circuit substrate 400 form a circuit such as a passive RFID chip.

The text above includes descriptions of physically contacting two structures such that thermal energy (i.e., heat) is passed from one structure to another structure. It will be appreciated that direct physical contact may not be required. Further, in some implementations, a release layer (not individually depicted for simplicity) between the two structures may be employed to prevent undesirable adhesion between the two structures. In this aspect, the two structures may not necessarily require physical contact, but will be in thermal communication with each other. For purposes of this description, the term "thermal communication" indicates that structures are arranged and positioned such that thermal energy can be passed from one structure to another. Two structures in "thermal communication" with each other indicate that heat may be passed from one structure to another, although direct physical contact between the two structures is not necessary but, in some cases, may be employed. Two layers in "thermal communication" may be physically separated or spaced by one or more other layers.

During the application of heat to the carrier 104 by the thermal print head 120 using the first pattern, the carrier 104 can be heated to a temperature of from about 150° C. to about 250° C., or from about 175° C. to about 225° C. Heating the carrier 104 to an excessively low temperature will result in heating the metal layer 102 to an temperature that is insufficient for processing according to the implementations discussed herein. Heating the carrier 104 to an excessively high temperature can damage the carrier 104 and may heat too large of an area of the metal layer 102, thereby resulting in a circuit with electrically shorted features or poorly formed features. During heating of the carrier 104, thermal energy in the form of heat thermally conducts through the carrier 104 to the metal layer 102. The heat is applied to the first portion 200 of the metal layer in the first pattern, and heats the first portion 200 of the metal layer 102 to a temperature of from about 150° C. to about 250° C., or from about 175° C. to about 225° C.

Referring back to FIG. 2, the metal layer 102 physically contacts the sacrificial print medium 110. Heating of the first portion 200 of the metal layer 102 results in adhesive forces between the sacrificial print medium 110 and the first portion 200 being stronger than the adhesive forces between the carrier 104 and the first portion 200. At FIG. 3, the carrier 104 is separated from the sacrificial print medium 110. The first portion 200 remains attached to the sacrificial print medium 110 and detaches from the carrier 104, while the second portion 202 remains attached to the carrier 104.

At FIG. 4, the second portion 202 of the metal layer 102 is physically contacted with the circuit substrate 400. The heating element 402 is physically contacted with the carrier 104 and heats the carrier 104 to a temperature of from about 150° C. to about 250° C. or from about 175° C. to about 225° C. The thermal energy in the form of heat thermally conducts through the carrier 104 to the second portion 202 of the metal layer 102. The heating element 402 heats the second portion 202 of the metal layer 102 to a temperature of from about 150° C. to about 250° C. or from about 175° C. to about 225° C. Heating of the second portion 202 of the metal layer 102 results in adhesive forces between the circuit substrate 400 and the second portion 202 being stronger than the adhesive forces between the carrier 104 and the second portion 202. At FIG. 5, the carrier 104 is separated from the circuit substrate 400. The second portion 202 remains attached to the circuit substrate 400 and detaches from the carrier 104.

Figure 6:
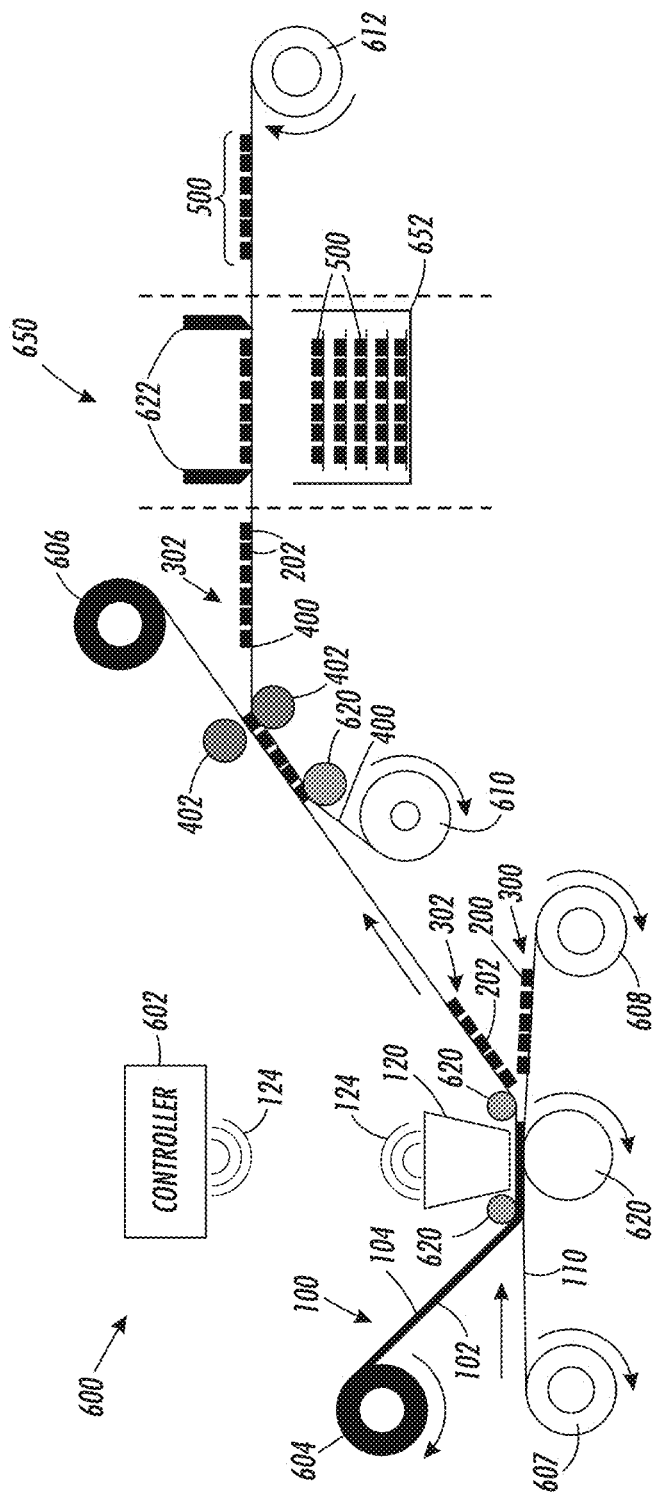
FIG. 6 is a schematic depiction of a thermal printing system in accordance with an implementation of the present teachings.

FIG. 6 depicts a thermal printing system 600 in accordance with an implementation of the present teachings that can be used during an automated process for manufacturing a plurality of electric circuits. For simplicity of explanation, and without limiting the present teachings, the structures of FIG. 6 are described with reference to the depictions of FIGS. 1-5, although it is contemplated other implementations can include structures and method acts that are not depicted for simplicity, while depicted structures and method acts may be removed or modified.

The thermal printing system 600 of FIG. 6 depicts a controller 602 coupled to the thermal print head 120 with a data bus 124. The thermal print head 120 is configured to print the first portion 200 of the metal layer 102. In FIG. 6, the data bus 124 is depicted as a wireless connection 124 that allows data to be transferred from the controller 602 to the thermal print head 120, and data such as operational information to be transferred from the thermal print head 120 to the controller 602. In some implementations, the controller 602 can send and/or receive operational instructions and/or information to and/or from other structures of the thermal printing system 600. In FIG. 6, the ribbon 100 is supplied on a ribbon supply reel 604, and the carrier 104 is collected on a carrier take-up reel 606. The ribbon supply reel 604 is configured to supply the ribbon 100 to the thermal print head 120. Similarly, the sacrificial print medium 110 is supplied on a sacrificial print medium supply reel 607 and collected, along with the first portion 200 of the metal layer 102, on a sacrificial print medium take-up reel 608. The sacrificial print medium supply reel 607 is configured to supply the sacrificial print medium 110 to the thermal print head 120. Further, the circuit substrate 400 is supplied on a circuit substrate supply reel 610 and, in some implementations as described below, may be collected (in whole or in part) on a circuit substrate take-up reel 612. The circuit substrate supply reel 610 is configured to supply the circuit substrate 400 to the heating element 402. The thermal printing system 600 can include other structures such as one or more pressure rolls 620 for positioning, repositioning, and/or directing various assemblies during printing of an electric circuit 500 and/or one or more cutters 622.

Further, in FIG. 6, the heating element 402 described above is implemented as a heat/pressure fuser (e.g., a fuser roller) 402, which includes a heat roller paired with a pressure roller. In this or similar implementations, it will be appreciated that the carrier 104 of the ribbon 100 as well as the circuit substrate 400 that receives the second portion 202 of the metal layer 102 should be selected to ensure that their melting points and/or flash points are acceptably high relative to the temperatures that might be placed on them at the heat/pressure fuser 402. The possibility exists that the carrier 104 and the circuit substrate 400 may dwell within the heat/pressure fuser 402, for example, due to a mechanical malfunction, a failure event, or a pause in production during a normal processing cycle. The carrier 104 and circuit substrate 400 should be selected and provided by materials that are able to withstanding temperatures placed on them during, for example, normal processing or a failure event without melting or igniting.

Figure 7:
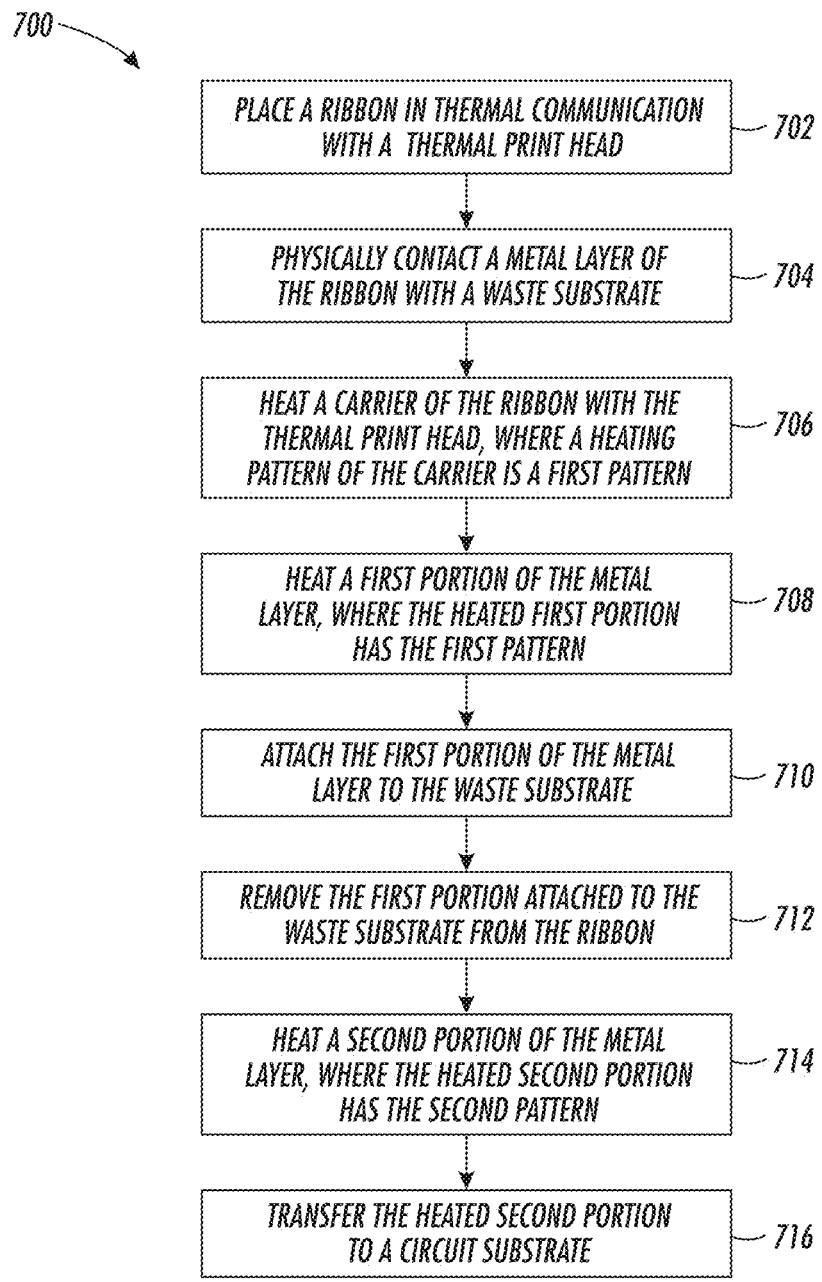
FIG. 7 is a flow chart depicting a method for forming a conductive structure such as an electric circuit in accordance with an implementation of the present teachings.

A method or process 700 for forming an electric circuit 500 is depicted in the flow diagram of FIG. 7. The method 700 may proceed by operation or use of one or more of the structures depicted in the figures described above, and thus is described with reference to FIGS. 1-6; however, it will be appreciated that the method 700 is not limited to any particular structure or use unless expressly stated herein. It will be appreciated that while the method 700 is described as a series of acts or events, the present teachings are not limited by the ordering of such acts or events. Some acts may occur in different orders and/or concurrently with other acts or events apart from those described herein. Further, a method in accordance with the present teachings may include other acts or events that have not been depicted for simplicity, while other depicted acts or events may be removed or modified.

The method 700 begins by placing a ribbon 100 in thermal communication with a thermal print head 120, as at 702. This can include unwinding the ribbon 100 from a ribbon supply reel 604 and positioning the ribbon 100 adjacent to, or in physical contact with, the thermal print head 120, and may include the use of one or more pressure rolls 620. The ribbon 100 can be or include a metal layer 102 positioned on a carrier 104.

At 704, the metal layer 102 is physically contacted with a sacrificial print medium 110. This can include unwinding the sacrificial print medium 110 from a sacrificial print medium supply reel 607, and may include the use of one or more pressure rolls 620. At this stage, the ribbon 100 may be positioned between the thermal print head 120 and the sacrificial print medium 110.

At 706, the carrier 104 of the ribbon 100 is heated by the thermal print head 120. A heating pattern applied to the carrier 104 by the thermal print head 120 is a first pattern, where the first pattern may be a negative or reverse image of the final electric circuit that is being formed.

Heat applied by the thermal print head 120 to the carrier 104 radiates through the carrier 104 to the metal layer 102, and is thereby applied to the metal layer 102. This heats a first portion 200 of the metal layer 102, where the heated first portion 200 has the first metal pattern 300, as at 708. The carrier 104, the metal layer 102, and the sacrificial print medium 110 are selected and designed so that first adhesive forces between the metal layer 102 and the carrier 104 are less than second adhesive forces between the metal layer 102 and the sacrificial print medium upon heating of the metal layer 102. When the metal layer 102 is heated and cooled, the first portion 200 of the metal layer 102 adheres to the sacrificial print medium 110 while an unheated second portion 202 of the metal layer 102 remains adhered to the carrier 104. This process thereby attaches the first portion 200 of the metal layer 102 to the sacrificial print medium 110 as at 710.

Subsequently, the carrier 104 is separated from the sacrificial print medium 110, which removes and detaches the first portion 200 of the metal layer 102 from the ribbon 100 as at 712, and leaves the second portion 202 of the metal layer 102 attached to the carrier 104. The second portion 202 of the metal layer 102 has a second pattern 302 that is a negative or reverse image of the first metal pattern 300, and a positive image of the final electric circuit that is being formed.

At 714, the second portion 202 of the metal layer 102 is heated, where the heated second portion 202 of the metal layer 102 has the second pattern 302. As depicted in FIG. 6, the heat can be applied to the second portion 202 by a heating element 402 such as a heat/pressure roller 402. During this heating, the second portion 202 may be placed in physical contact with a circuit substrate 400 as depicted at FIG. 6, where the circuit substrate 400 can be supplied from a circuit substrate supply reel 610. The carrier 104, the metal layer 102, and the circuit substrate 400 are designed so that first adhesive forces between the metal layer 102 and the carrier 104 are less than third adhesive forces between the metal layer 102 and the circuit substrate 400. When the second portion 202 of the metal layer 102 is heated and cooled, the second portion 202 of the metal layer 102 adheres to the circuit substrate 400. This process thereby transfers the second portion 202 of the metal layer 102 to the circuit substrate 400 as at 716.

Referring back to FIG. 6, the thermal printing system 600 can be used to form a plurality of electric circuits 500 in series or parallel. After transferring the second portion 202 of the metal layer 102 to the circuit substrate 400, additional processing can be performed. In one implementation, each electric circuit 500 can be singularized from two or more adjacent electric circuits 500 using one or more cutters 622 at a sectioning station 650. The cutters 622 may, for example, punch a perimeter of the plurality of electric circuits 500 from the circuit substrate 400, such that the plurality of electric circuits 500 are singularized (i.e., separated from each other) using a cutting process such as a punching process. The singularized electric circuits 500 can be collected in a container (e.g., a bin, hopper, vessel, etc.) 652, while the remaining circuit substrate 400 from which the electric circuits 500 have been removed, can be collected on the circuit substrate take-up reel 612.

In an alternate process, the sectioning station 650 can be omitted. The electric circuits 500, including the second portion 202 of the metal layer 102 and the circuit substrate 400, can be collected on the take-up reel 612. The take-up reel 612 with a plurality of electric circuits 500 can be sent to a buyer or used during additional processing.

The sacrificial print medium 110 and first portion 200 of the metal layer 102 can be collected on the sacrificial print medium take-up reel 608. The first portion 200 may be removed from the sacrificial print medium 110, and the first portion 200 and sacrificial print medium 110 can be reused and/or recycled. Similarly, in some processes, the carrier 104 of the ribbon 100 can be collected on the carrier take-up reel 606 and reused or recycled.

It will be appreciated that the electric circuit that is printed can be easily changed, for example, through software sent from the controller 602 to the thermal print head 120. In some methods, processing of electric circuits 500 of a first design can be stopped, and software instructions for printing a second circuit design different from the first circuit design can be sent from the controller 602 to the thermal print head 120. Processing can then be restarted, printing the second circuit design. Switching from printing the first circuit design to printing the second circuit design can be performed without replacing the ribbon 100, the sacrificial print medium 110, or the circuit substrate 400. In some processes, particularly where the electric circuits 500 are collected on the circuit substrate take-up reel 612, replacing the circuit substrate 400 when switching from the first design to the second design may be desirable so that only one circuit design is collected on the circuit substrate take-up reel 612, although multiple circuit types on a single circuit substrate take-up reel 612 is contemplated.

The text above includes descriptions of physically contacting two structures such that thermal energy (i.e., heat) is passed from one structure to another structure. It will be appreciated that direct physical contact may not be required. In some implementations, a release layer between the two structures may be desired to prevent undesirable adhesion between the two structures. In this aspect, the two structures may not necessarily require physical contact, but will be in thermal communication with each other. For purposes of this description, the term "thermal communication" indicates that thermal energy can be passed from one structure to another. Two structures in "thermal communication" with each other indicate that heat may be passed from one structure to another, although direct physical contact between the two structures is not necessary but, in some cases, may be employed.

Further, it will be realized by one of ordinary skill in the art that heat transfer from a first structure to a second structure, such as from a thermal print head to a carrier and from a carrier to a metal layer attached to the carrier, through physical contact necessarily has some variations of the original pattern applied to the first structure and the pattern transferred to the second pattern. While the heat pattern applied to the second structure, therefore, may not be identical to the original heat pattern applied to the first structure, the second heat pattern approximates the first heat pattern.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or implementations of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or A and B. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated implementation. Finally, "exemplary" indicates the description is used as an example, rather than implying that it is an ideal. Other implementations of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. A thermal printing system for forming a plurality of electric circuits, comprising:
   a thermal print head;
   a sacrificial print medium positioned adjacent to the thermal print head;
   a ribbon positioned between the thermal print head and the sacrificial print medium, wherein:

the ribbon comprises a carrier (labelled white in 100 as upper layer, and a metal layer (labelled black in 100 as lower layer)

the thermal print head is configured to print a first portion of the metal layer onto the sacrificial print medium;

the first portion of the metal layer is a negative image of at least one electric circuit and comprises a first pattern;

subsequent to printing the first portion of the metal layer, a second portion of the metal layer remains on the carrier wherein the second portion of the metal layer comprises a second pattern that is a reverse image of the first pattern;

a circuit substrate positioned adjacent to the carrier and the second portion of the metal layer;

a heating element for transferring the second portion of the metal layer from the carrier onto the circuit substrate; and a third portion of the metal layer on the circuit substrate, wherein the third portion of the metal layer comprises the second pattern that is the reverse image of the first pattern.

2. The thermal printing system of claim 1, further comprising:
a ribbon supply reel configured to supply the ribbon to the thermal print head; and
a carrier take-up reel configured to receive the carrier after transferring the second portion of the metal layer to the circuit substrate.

3. The thermal printing system of claim 2, further comprising:
a sacrificial print medium supply reel configured to supply the sacrificial print medium to the thermal print head; and
a sacrificial print medium take-up reel configured to receive the sacrificial print medium and the first portion of the metal layer subsequent to printing the first portion of the metal layer.

4. The thermal printing system of claim 3, further comprising:
a circuit substrate supply reel configured to supply the circuit substrate to the heating element; and
a circuit substrate take-up reel configured to receive at least a portion of the circuit substrate subsequent to the transferring of the second portion of the metal layer to the circuit substrate.

5. The thermal printing system of claim 2, further comprising at least one cutter configured to punch a perimeter of the plurality of electric circuits from the circuit substrate subsequent to transferring the second portion of the metal layer to the circuit substrate, thereby singularizing the plurality of electric circuits.

6. The thermal printing system of claim 1, further comprising a controller configured to provide printing instructions to the thermal print head.

7. The thermal printing system of claim 1, wherein:
the metal layer comprises at least one of silver, copper, a composite comprising silver and copper, aluminum, or gold, and has a thickness of from 0.5 micrometers to 15 micrometers;
the carrier comprises at least one of paper, polyester, polyimide, and fabric, and has a thickness of from 25 micrometers to 75 micrometers; and
the sacrificial print medium comprises at least one of paper, polyester, polyimide, and fabric, and has a thickness of from 25 micrometers to 75 micrometers.

8. The thermal printing system of claim 7, wherein the second portion of the metal layer is at least a portion of a radio-frequency identification chip.

9. A thermal printing system, comprising:
a ribbon supply, a carrier take-up, and a ribbon positioned between the ribbon supply and the carrier take-up, wherein the ribbon comprises a carrier and a metal layer positioned on or over the carrier;
a sacrificial print medium supply, a sacrificial print medium take-up, and a sacrificial print medium positioned between the sacrificial print medium supply and the sacrificial print medium take-up;
a circuit substrate supply, a circuit substrate take-up, and a circuit substrate positioned between the circuit substrate supply and the circuit substrate take-up;
a thermal print head positioned adjacent to the ribbon and configured to print a first portion of the metal layer onto the sacrificial print medium and to leave a second portion of the metal layer on or over the carrier;
a first portion of the metal layer on the sacrificial print medium and a second portion of the metal layer on or over the carrier, wherein the first portion of the metal layer comprises a first pattern and the second portion of the metal layer comprises a second pattern that is a reverse image of the first pattern; and
a third portion of the metal layer on the circuit substrate, wherein the third portion of the metal layer comprises the second pattern that is the reverse image of the first pattern.

10. The thermal printing system of claim 9, wherein the third portion of the metal layer comprises a portion of the second portion of the metal layer transferred from the carrier.

11. The thermal printing system of claim 9, wherein:
the ribbon supply is a ribbon supply reel, the sacrificial print medium supply is a sacrificial print medium supply reel, and the circuit substrate supply is a circuit substrate supply reel; and
the carrier take-up is a carrier take-up reel, the sacrificial print medium take-up is a sacrificial print medium take-up reel, and the circuit substrate take-up is a circuit substrate take-up reel.

12. The thermal printing system of claim 9, wherein:
the thermal print head is in physical contact with the ribbon; and
the metal layer is in physical contact with the sacrificial print medium.

13. The thermal printing system of claim 9, further comprising a pressure roll, wherein the second portion of the metal layer and the circuit substrate are positioned between the carrier and the pressure roll.

14. The thermal printing system of claim 9, further comprising a heating element, wherein the second portion of the metal layer and the circuit substrate are positioned between the carrier and the heating element during a transfer of the second portion of the metal layer to the circuit substrate.

15. The thermal printing system of claim 9, further comprising a sectioning station comprising one or more cutters configured to separate a plurality of electric circuits from each other, wherein the plurality of electric circuits comprise the third portion of the metal layer and the circuit substrate.

16. The thermal printing system of claim 15, wherein the plurality of electric circuits are a plurality of radio-frequency identification chips.

17. The thermal printing system of claim 9, wherein the thermal print head is configured to heat the carrier with a first heat pattern that approximates the first pattern of the first portion of the metal layer.

18. The thermal printing system of claim 9, wherein the metal layer comprises at least one of silver, copper, a composite comprising silver and copper, aluminum, or gold, and has a thickness of from 0.5 micrometers to 15 micrometers.

19. The thermal printing system of claim 9, wherein the carrier comprises at least one of paper, polyester, polyimide, and fabric, and has a thickness of from 25 micrometers to 75 micrometers.

20. The thermal printing system of claim 9, wherein the sacrificial print medium comprises at least one of paper, polyester, polyimide, and fabric, and has a thickness of from 25 micrometers to 75 micrometers.

\* \* \* \* \*